United States Patent
Le et al.

(10) Patent No.: US 12,009,433 B2
(45) Date of Patent: Jun. 11, 2024

(54) MULTI-DIELECTRIC GATE STACK FOR CRYSTALLINE THIN FILM TRANSISTORS

(71) Applicant: Intel Corporation, Santa Clara, CA (US)

(72) Inventors: Van H. Le, Portland, OR (US); Inanc Meric, Portland, OR (US); Gilbert Dewey, Beaverton, OR (US); Sean Ma, Portland, OR (US); Abhishek A. Sharma, Hillsboro, OR (US); Miriam Reshotko, Portland, OR (US); Shriram Shivaraman, Hillsboro, OR (US); Kent Millard, Hillsboro, OR (US); Matthew V. Metz, Portland, OR (US); Wilhelm Melitz, Portland, OR (US); Benjamin Chu-Kung, Portland, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 863 days.

(21) Appl. No.: 16/001,837

(22) Filed: Jun. 6, 2018

(65) Prior Publication Data

US 2019/0378932 A1 Dec. 12, 2019

(51) Int. Cl.
| | |
|---|---|
| *H01L 29/786* | (2006.01) |
| *H01L 21/28* | (2006.01) |
| *H01L 29/06* | (2006.01) |
| *H01L 29/417* | (2006.01) |
| *H01L 29/423* | (2006.01) |
| *H01L 29/66* | (2006.01) |

(52) U.S. Cl.
CPC .. *H01L 29/78678* (2013.01); *H01L 21/28194* (2013.01); *H01L 29/0649* (2013.01); *H01L 29/41733* (2013.01); *H01L 29/42384* (2013.01); *H01L 29/66765* (2013.01); *H01L 29/7869* (2013.01)

(58) Field of Classification Search
CPC ........... H01L 29/0649; H01L 29/41733; H01L 29/7869; H01L 29/78678; H01L 29/42384; H01L 29/66765; H01L 21/28194
See application file for complete search history.

(56) References Cited

U.S. PATENT DOCUMENTS

| | | | | |
|---|---|---|---|---|
| 6,013,553 A | * | 1/2000 | Wallace | ............ H01L 21/28185 438/287 |
| 6,563,174 B2 | * | 5/2003 | Kawasaki | ......... H01L 29/66969 257/E29.151 |

(Continued)

*Primary Examiner* — Dale E Page
*Assistant Examiner* — Quovaunda Jefferson
(74) *Attorney, Agent, or Firm* — Schwabe, Williamson & Wyatt P.C.

(57) ABSTRACT

Embodiments disclosed herein include thin film transistors and methods of forming such thin film transistors. In an embodiment, the thin film transistor may comprise a substrate, a gate electrode over the substrate, and a gate dielectric stack over the gate electrode. In an embodiment, the gate dielectric stack may comprise a plurality of layers. In an embodiment, the plurality of layers may comprise an amorphous layer. In an embodiment, the thin film transistor may also comprise a semiconductor layer over the gate dielectric. In an embodiment, the semiconductor layer is a crystalline semiconductor layer. In an embodiment, the thin film transistor may also comprise a source electrode and a drain electrode.

8 Claims, 8 Drawing Sheets

(56) References Cited

U.S. PATENT DOCUMENTS

| | | | | |
|---|---|---|---|---|
| 6,818,517 | B1* | 11/2004 | Maes | C23C 16/345 |
| | | | | 438/287 |
| 6,864,163 | B1* | 3/2005 | Yu | H01L 21/823842 |
| | | | | 438/587 |
| 7,537,804 | B2* | 5/2009 | Srividya | H01L 21/02181 |
| | | | | 427/255.31 |
| 2010/0059749 | A1* | 3/2010 | Takahashi | H01L 29/04 |
| | | | | 257/E29.291 |
| 2010/0209702 | A1* | 8/2010 | Tsai | C23C 16/403 |
| | | | | 427/255.28 |
| 2011/0284837 | A1* | 11/2011 | Nishijima | H01L 29/7869 |
| | | | | 257/43 |
| 2015/0137113 | A1* | 5/2015 | Yu | H01L 29/66969 |
| | | | | 257/43 |
| 2016/0251264 | A1* | 9/2016 | Miyanaga | H01J 37/3429 |
| | | | | 252/519.51 |
| 2017/0170213 | A1* | 6/2017 | Li | H01L 27/1225 |
| 2018/0061870 | A1* | 3/2018 | Yang | H01L 29/66969 |

\* cited by examiner

MULTI-DIELECTRIC GATE STACK FOR CRYSTALLINE THIN FILM TRANSISTORS

TECHNICAL FIELD

Embodiments of the disclosure are in the field of semiconductor structures and processing and, in particular, to thin film transistors with a crystalline semiconductor and a multi-layer amorphous gate dielectric.

BACKGROUND

In order to allow for crystalline thin film transistors to self-align, the gate dielectric needs to be amorphous. Currently, amorphous $SiO_2$ is commonly used to form the gate dielectric. $SiO_2$ provides the ability to form relatively thick amorphous gate dielectrics needed to minimize leakage in the device. However, $SiO_2$ is a low-k oxide and, therefore, does not provide high electrostatic performance. High-k films would provide improved electrostatic performance, but it is currently not possible to provide an amorphous high-k film that has the necessary thickness to minimize leakage current. Particularly, as the thickness of a high-k dielectric film increases, the film begins to crystallize. Accordingly, currently available high-k dielectric films are not suitable for use in crystalline thin film transistors.

DESCRIPTION OF THE EMBODIMENTS

Figure 1A:
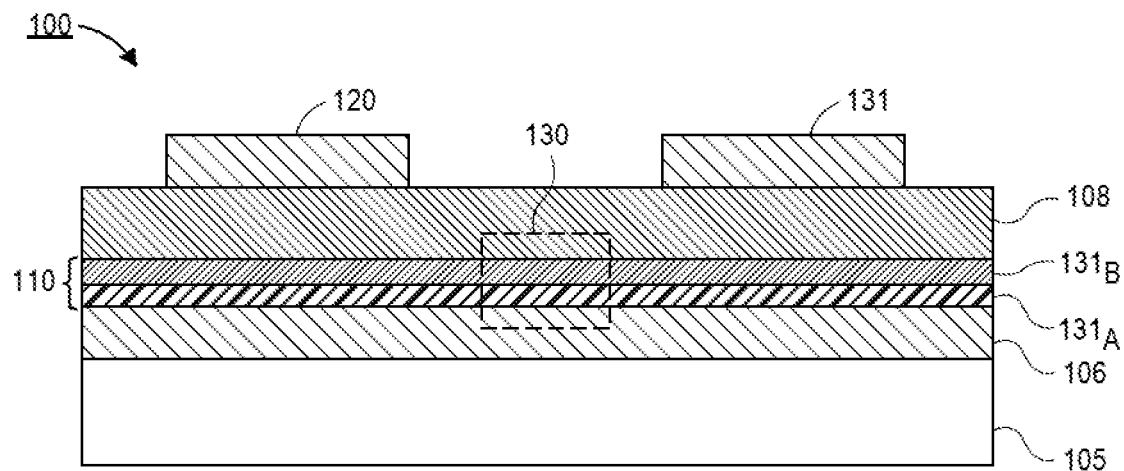
FIG. 1A is a cross-sectional illustration of a crystalline thin film transistor with a gate dielectric stack that comprises a multi-layer stack, in accordance with an embodiment.

Embodiments described herein comprise thin film transistors with a crystalline semiconductor and a multi-layer amorphous gate dielectric and methods of forming such devices. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, high-k dielectric materials are not currently used in crystalline thin film transistors (TFTs) because currently available processing methods do not allow for the high-k materials to be formed in an amorphous state. Particularly, as the thickness of the high-k dielectric increases, the high-k dielectric becomes more susceptible to crystallizing. A crystalline high-k material is not suitable for crystalline TFTs because the crystalline structure of the high-k dielectric prevents the semiconductor material of the TFT from being able to self-align.

Accordingly, embodiments described herein include crystalline TFTs that comprise high-k dielectric gate stacks that are amorphous and methods of forming such devices. Such embodiments allow for crystalline TFTs that have improved electrostatic performance compared to crystalline TFTs that are formed with low-k dielectrics, such as $SiO_2$. Embodiments described herein provide amorphous high-k dielectric stacks that comprise a plurality of dielectric material layers. In an embodiment, an uppermost layer of the gate dielectric stack is a material that frustrates the conversion of the gate dielectric to a crystalline layer. In an additional embodiment, the gate dielectric stack comprises alternating layers of two or more dielectric materials, where each of the dielectric layers has a thickness that is small enough to prevent crystallization of the dielectric layer.

Referring now to FIG. 1A, a cross-sectional illustration of a crystalline TFT 100 is shown, in accordance with an embodiment. In an embodiment, the crystalline TFT 100 may be formed over a substrate 105. In an embodiment, the substrate 105 may be any suitable substrate 105 for forming a TFT. For example, the substrate 105 may be glass, ceramic, or the like. In an embodiment, the substrate 105 may also comprise semiconducting materials, such as silicon, III-V semiconductors, a silicon on insulator (SOI), or the like. In the illustrated embodiment, the TFT 100 is illustrated as being formed directly over the substrate 105, though it is to be appreciated that other configurations are also included in additional embodiments. For example, the TFT 100 may be formed in a back end of line (BEOL) stack over an underlying semiconductor substrate. Additional embodiments may include a TFT 100 that further is formed over underlying TFTs (e.g., a stack of a plurality of TFTs 100 may be formed in some embodiments).

In an embodiment, the TFT 100 may comprise a gate electrode 106 formed over the substrate 105. In an embodiment, the gate electrode 106 may be any suitable conductive material. For example, the gate electrode 106 may comprise one or more of Cu, Al, Ti, Zr, Hf, V, Ru, Co, Ni, Pd, Pt, W, Ag, Au or alloys thereof. In an embodiment, the gate electrode 106 may also comprise stacks of one or more conductive layers.

In an embodiment, a gate dielectric stack 110 may be formed over the gate electrode 106. In an embodiment, the gate dielectric stack 110 may comprise two or more high-k dielectric materials. As used herein, "high-k" dielectric materials refers to materials that have a k-value that is greater than the k-value of $SiO_2$. For example, "high-k" dielectric materials may refer to dielectric materials with a k-value that is greater than 3.9. In an embodiment, the gate dielectric stack may comprise one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In an embodiment, the gate dielectric stack may also comprise high-k dielectric materials that are alloyed with or doped with silicon. For example, the atomic weight percent of silicon in a high-k dielectric material may be 50% or less, 20% or less, or 5% or less.

In an embodiment, the one or more of the high-k dielectric layers of the gate dielectric stack 110 may be amorphous. In a particular embodiment, an uppermost layer of the gate dielectric stack 110 may be amorphous. Accordingly, the subsequently formed semiconductor layer 108 will be formed on an amorphous layer. In FIG. 1A, the gate dielectric stack 110 is illustrated as being comprised of a first dielectric layer $131_A$ and a second dielectric layer $131_B$. However, it is to be appreciated that the gate dielectric stack 110 may comprise any number of layers, as will be described in greater detail below.

In an embodiment, a crystalline semiconductor layer 108 may be formed over the gate dielectric stack 110. In an embodiment, the crystalline semiconductor layer 108 may comprise one or more layers of semiconductor material. For example, semiconductor layer 108 may comprise one or more of ZnO, $Al_2O_5Zn_2$, aluminum doped ZnO (AZO), InZnO (IZO), indium tin oxide (ITO), InZnO, $In_2O_3$, $Ga_2O_3$, InGaZnO, semiconductor materials comprising other materials, combinations (e.g., alloys or stacked layers) of semiconductor materials, and the like. As used herein, the term "crystalline semiconductor" may refer to polycrystalline or single crystalline semiconductors. In an embodiment, the crystalline semiconductor layer 108 may comprise a plurality of layers, where at least one of the layers is a crystalline semiconductor.

In an embodiment, the TFT 100 may further comprise a source electrode 120 and a drain electrode 121. In an embodiment, the source electrode 120 and the drain electrode may be formed over a surface of the semiconductor layer 108 that is opposite from a surface of the semiconductor layer 108 that faces the gate electrode 106. In the illustrated embodiment, the TFT 100 is illustrated as having a bottom gate with a staggered configuration between the source/drain electrode and the gate dielectric stack 110. However, it is to be appreciated that embodiments may also comprise a source electrode 120 and drain electrode 121 that are formed directly in contact with the gate dielectric stack 110 with the semiconductor layer formed over the gate dielectric stack 110 between the source electrode 120 and the drain electrode 121, or any other suitable TFT configuration. In an embodiment, the source electrode 120 and the drain electrode 121 may be any suitable conductive material. For example, the source electrode 120 and the drain electrode 121 may comprise one or more of Cu, Al, Ti, Zr, Hf, V, Ru, Co, Ni, Pd, Pt, W, Ag, Au or alloys thereof. In an embodiment, the source electrode 120 and the drain electrode 121 may also comprise stacks of one or more conductive layers.

Figure 1B:
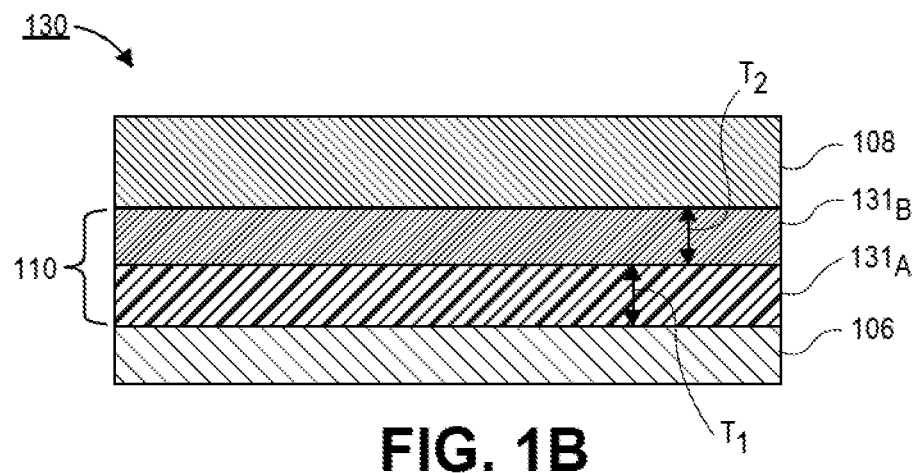
FIG. 1B is a cross-sectional illustration of a gate dielectric stack that comprises a bilayer, in accordance with an embodiment.

Referring now to FIG. 1B, a zoomed in illustration of box 130 in FIG. 1A is shown, in accordance with an embodiment. In an embodiment box 130 provides a more clear illustration of the gate dielectric stack 110. For example, in FIG. 1B, the gate dielectric stack 110 is shown as a bilayer that comprises a first high-k dielectric layer $131_A$ and a second high-k dielectric layer $131_B$. In an embodiment, the first high-k dielectric layer $131_A$ may be a different material than the second high-k dielectric layer $131_B$. In an embodiment, the second high-k dielectric layer $131_B$ may be an amorphous dielectric layer. In an embodiment, the first high-k dielectric layer $131_A$ and the second high-k dielectric layer $131_B$ may both be amorphous dielectric layers. In a particular embodiment, the second high-k dielectric layer $131_B$ may be a high-k dielectric material that is resistant to crystallization. For example, the second high-k dielectric layer $131_B$ may be $Al_2O_3$. In a particular embodiment, the first high-k dielectric layer $131_A$ may be $HfO_2$ and the second high-k dielectric layer $131_B$ may be $Al_2O_3$. In an additional embodiment, the first high-k dielectric layer $131_A$ may be $Al_2O_3$ and the second high-k dielectric layer $131_B$ may be $HfO_2$. However, it is to be appreciated that the first high-k dielectric layer $131_A$ and the second high-k dielectric layer $131_B$ may be any suitable high-k dielectric material, such as one of those described above.

In an embodiment, the first high-k dielectric layer $131_A$ has a first thickness $T_1$ and the second high-k dielectric layer $131_B$ has a second thickness $T_2$. In an embodiment, the first thickness $T_1$ may be substantially the same as the second thickness $T_2$. In an embodiment, the first thickness $T_1$ and the second thickness $T_2$ may have a thickness that is below a threshold thickness where the dielectric layers begin to be susceptible to crystallization. The thickness at which a material layer becomes susceptible to crystallization is dependent on the particular material. For example, $HfO_2$ begins to be susceptible to crystallization at a thickness of approximately 2 nm. However, in general the high-k dielectric materials that have a thickness of approximately 4 nm or less may be considered less susceptible to crystallization.

While FIG. 1B provides an illustration of the gate dielectric stack 110 with a first high-k dielectric and a second high-k dielectric that have substantially the same thickness, it is to be appreciated that embodiments are not limited to such configurations. For example, the first high-k dielectric may have a different thickness than the second high-k dielectric, as is shown in FIG. 1C.

Figure 1C:
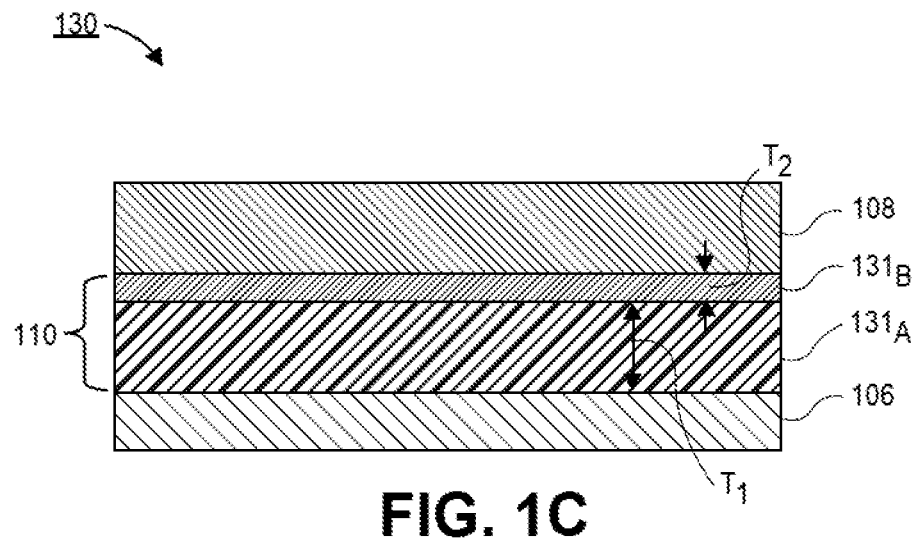
FIG. 1C is a cross-sectional illustration of a gate dielectric stack that comprises a bilayer where a first layer has a thickness that is greater than a thickness of a second layer, in accordance with an embodiment.

Referring now to FIG. 1C, a cross-sectional illustration of the gate dielectric stack 110 is shown, in accordance with an embodiment. In an embodiment, the gate dielectric stack 110 may comprise a first high-k dielectric $131_A$ that has a first thickness $T_1$ that is greater than a second thickness $T_2$ of a second high-k dielectric $131_B$. In an embodiment, the first thickness $T_1$ may be greater than the second thickness $T_2$ because the first high-k dielectric $131_A$ may be less susceptible to crystallization than the second high-k dielectric $131_B$ and can, therefore, be grown to a greater thickness. In an embodiment, the first high-k dielectric $131_A$ may also be a non-amorphous material layer since it does not interface with the semiconductor layer 108.

Figure 1D:
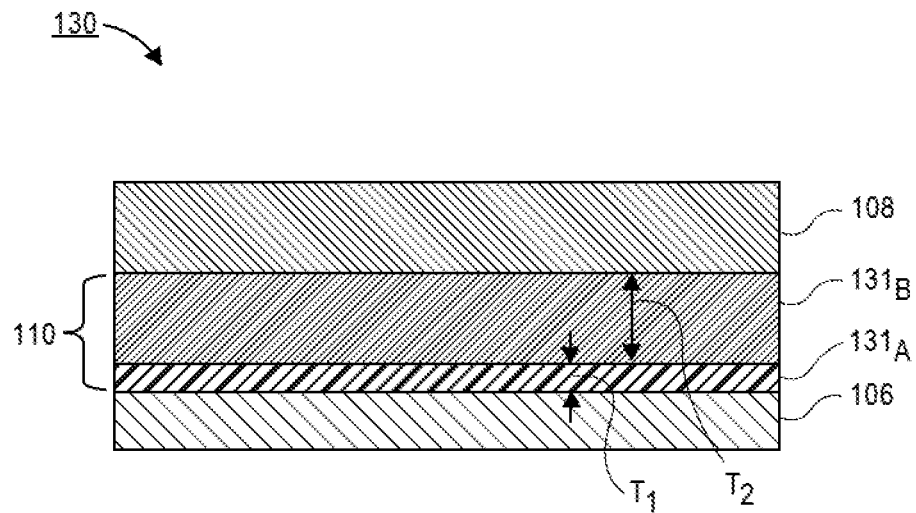
FIG. 1D is a cross-sectional illustration of a gate dielectric stack that comprises a bilayer where a first layer has a thickness that is smaller than a thickness of a second layer, in accordance with an embodiment.

Referring now to FIG. 1D, a cross-sectional illustration of the gate dielectric stack 110 is shown, in accordance with an additional embodiment. In an embodiment, the gate dielectric stack 110 may comprise a first high-k dielectric $131_A$ that has a first thickness $T_1$ that is less than a second thickness $T_2$ of a second high-k dielectric $131_B$. In an embodiment, the first thickness $T_1$ may be less than the second thickness $T_2$ because the first high-k dielectric $131_A$ may be more susceptible to crystallization than the second high-k dielectric $131_B$ and cannot, therefore, be grown to a thickness equal to the second high-k dielectric $131_B$.

Figure 2A:
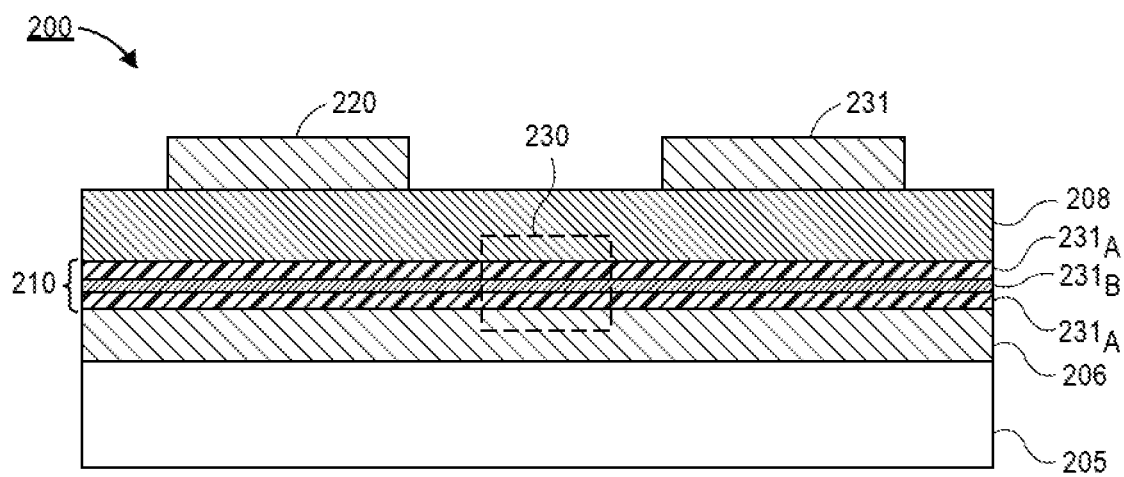
FIG. 2A is a cross-sectional illustration of a crystalline thin film transistor that comprises a gate dielectric stack that comprises a stack of alternating dielectric materials, in accordance with an embodiment.

Referring now to FIG. 2A, a cross-sectional illustration of a crystalline TFT 200 is shown, in accordance with an embodiment. In an embodiment, TFT 200 may be substantially similar to TFT 100 described above with respect to FIG. 1A, with the exception that the gate dielectric stack 210 may comprise alternating layers of two or more high-k dielectric materials. For example, In FIG. 2A, the gate dielectric stack 210 comprises a first high-k dielectric layer $231_A$ that is alternating with a second high-k dielectric layer $231_B$.

Figure 2B:
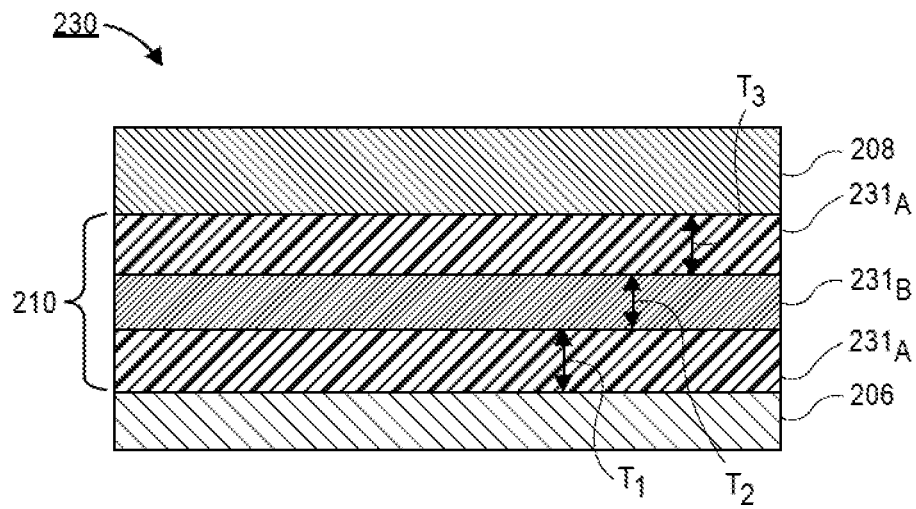
FIG. 2B is a cross-sectional illustration of a gate dielectric stack that comprises a first dielectric material layered over and below a second dielectric material, in accordance with an embodiment.

Referring now to FIG. 2B, a zoomed in illustration of box 230 in FIG. 2A is shown, in accordance with an embodiment. As shown, the gate dielectric stack 210 may comprise a bottommost high-k dielectric layer $231_A$ that is formed over the gate electrode 206, a second high-k dielectric $231_B$ over the bottommost high-k dielectric $231_A$, and an uppermost first high-k dielectric $231_A$ over the second high-k dielectric $231_B$. In an embodiment, the first high-k dielectric 231 may be $Al_2O_3$ and the second high-k dielectric $231_B$ may be $HfO_2$. However, it is to be appreciated that embodiments may include first and second high-k dielectrics that comprises any suitable high-k dielectric material, such as those described above.

In an embodiment, the bottommost first high-k dielectric layer $231_A$ may have a first thickness $T_1$, the second high-k dielectric layer $231_B$ may have a second thickness $T_2$, and the uppermost first high-k dielectric layer $231_A$ may have a third thickness $T_3$. In an embodiment, the first thickness $T_1$, the second thickness $T_2$, and the third thickness $T_3$ may be substantially the same. While the thicknesses $T_1$-$T_3$ are illustrated as being substantially the same, it is to be appreciated that embodiments are not limited to such configurations.

Figure 2C:
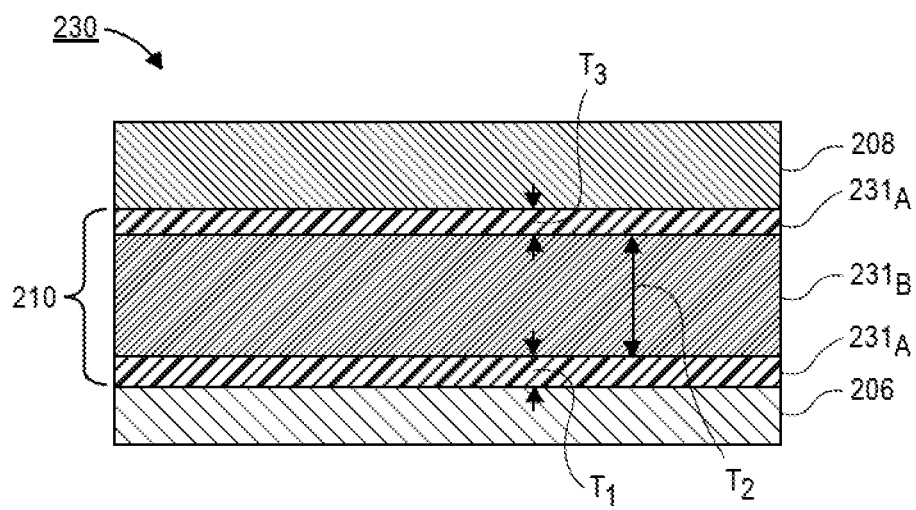
FIG. 2C is a cross-sectional illustration of a gate dielectric stack that comprises a first dielectric material layered over and below a second dielectric material, where a thickness of the second dielectric material is greater than a thickness of each layer of the first dielectric material, in accordance with an embodiment.

For example, in FIG. 2C a cross-sectional illustration of the gate dielectric stack where the thicknesses $T_1$-$T_3$ are not the same is shown, in accordance with an embodiment. In an embodiment, the thicknesses $T_1$ and $T_3$ of the first high-k dielectric layers $231_A$ may be substantially the same, and the thickness $T_2$ of the second high-k dielectric layer $231_B$ may be different than the thicknesses $T_1$ and $T_3$. In an embodiment, the second high-k dielectric layer $231_B$ may have a thickness $T_2$ that is greater than the thicknesses $T_1$ and $T_3$. In an embodiment, the second high-k dielectric layer $231_B$ may have a thickness $T_2$ that is greater than the thicknesses $T_1$ and $T_3$ because the second high-k dielectric layer $231_B$ is formed with a material that is less susceptible to crystallizing than the first high-k dielectric layers $231_A$. While the thicknesses $T_1$ and $T_3$ are illustrated as being substantially similar, it is to be appreciated that embodiments may also comprise a first thickness $T_1$ and a third thickness $T_3$ that are not substantially the same.

Figure 2D:
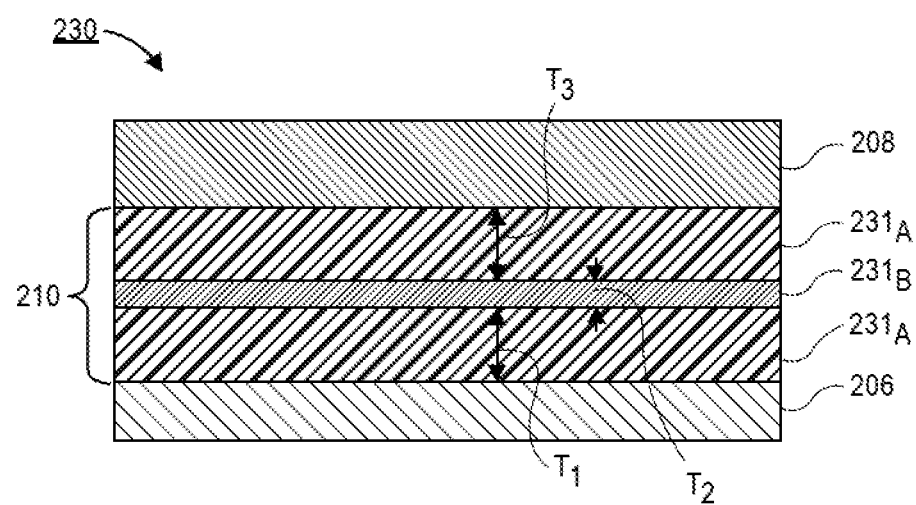
FIG. 2D is a cross-sectional illustration of a gate dielectric stack that comprises a first dielectric material layered over and below a second dielectric material, wherein a thickness of the second dielectric material is less than a thickness of each layer of the first dielectric material, in accordance with an embodiment.

Referring now to FIG. 2D, a cross-sectional illustration of the gate dielectric stack 210 is shown, in accordance with an additional embodiment. In an embodiment, the second high-k dielectric may have a thickness $T_2$ that is less than a thickness $T_1$ and $T_3$ of the bottommost first high-k dielectric $231_A$ and the uppermost first high-k dielectric $231_A$. In an embodiment, the second high-k dielectric layer $231_B$ may have a thickness $T_2$ that is less than the thicknesses $T_1$ and $T_3$ because the second high-k dielectric layer $231_B$ is formed with a material that is more susceptible to crystallizing than the first high-k dielectric layers $231_A$. While the thicknesses $T_1$ and $T_3$ are illustrated as being substantially similar, it is to be appreciated that embodiments may also comprise a first thickness $T_1$ and a third thickness $T_3$ that are not substantially the same.

Figure 2E:
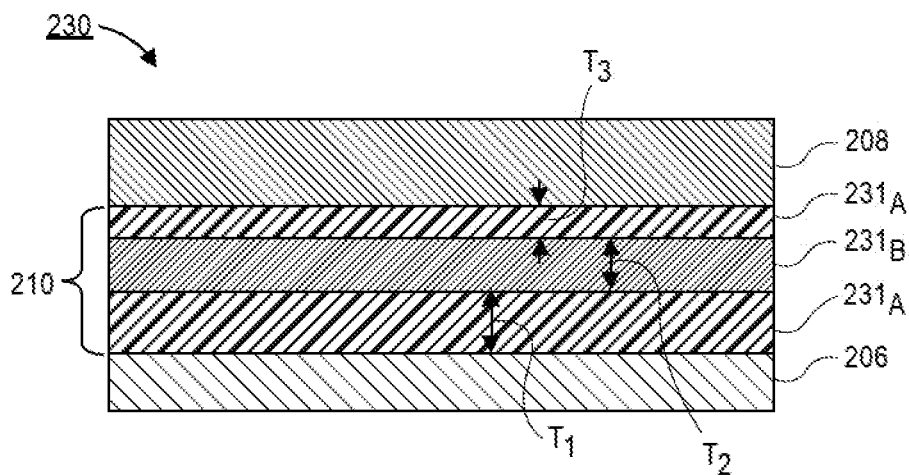
FIG. 2E is a cross-sectional illustration of a gate dielectric stack that comprises a plurality of layers where each layer has a different thickness, in accordance with an embodiment.

Referring now to FIG. 2E, a cross-sectional illustration of the gate dielectric stack 210 is shown, in accordance with an additional embodiment. In an embodiment, the gate dielectric stack 210 may comprise a bottommost first high-k dielectric layer $231_A$ that has a first thickness $T_1$, a second high-k dielectric layer $231_B$ that has a second thickness $T_2$, and an uppermost first high-k dielectric layer $231_A$ that has a third thickness $T_3$. In an embodiment, the first thickness $T_1$, the second thickness $T_2$, and the third thickness $T_3$ may not all be the same. In an embodiment, the third thickness $T_3$ of the uppermost first high-k dielectric layer $131_A$ may be the smallest thickness. For example, the third thickness $T_3$ may be the smallest to ensure that it does not crystallize during the formation of the crystalline semiconductor layer 208.

Figure 2F:
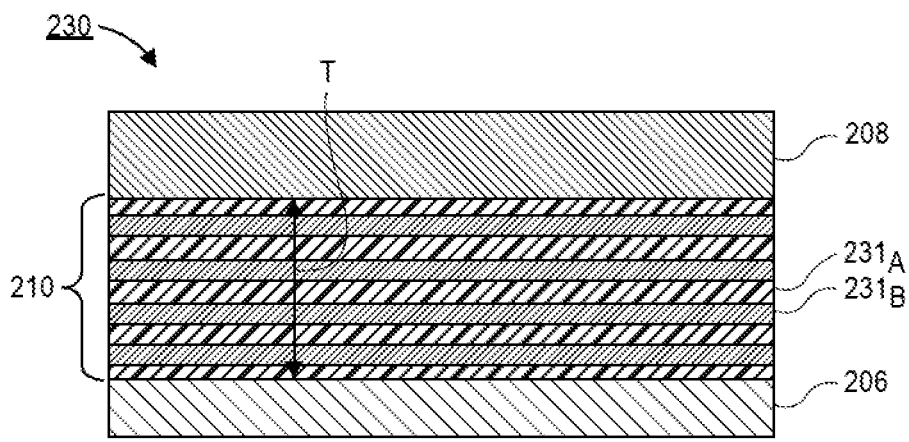
FIG. 2F is a cross-sectional illustration of a gate dielectric stack that comprises a plurality of alternating first dielectric layers and second dielectric layers, in accordance with an embodiment.

Referring now to FIG. 2F, a cross-sectional illustration of the gate dielectric stack 210 is shown, in accordance with an additional embodiment. In an embodiment, the gate dielectric stack 210 may comprise a plurality of alternating first high-k dielectric layers $231_A$ and second high-k dielectric layers $231_B$. In an embodiment, the alternating layers of the first high-k dielectric layers $231_A$ and the second high-k dielectric layers $231_B$ may be referred to as a superlattice. In an embodiment, each of the alternating high-k dielectric layers may have a thickness below a threshold where crystallization occurs. In an embodiment, the plurality of alternating layers may comprise as many layers as needed to provide a desired total thickness T. Since the total thickness T is comprised of a plurality of alternating high-k dielectric layers that are below the crystallization threshold thickness, the gate dielectric stack 210 may be amorphous and have a thickness T sufficient to minimize leakage. In an embodiment, the total thickness T may be between approximately 2 nm and 10 nm.

Figure 2G:
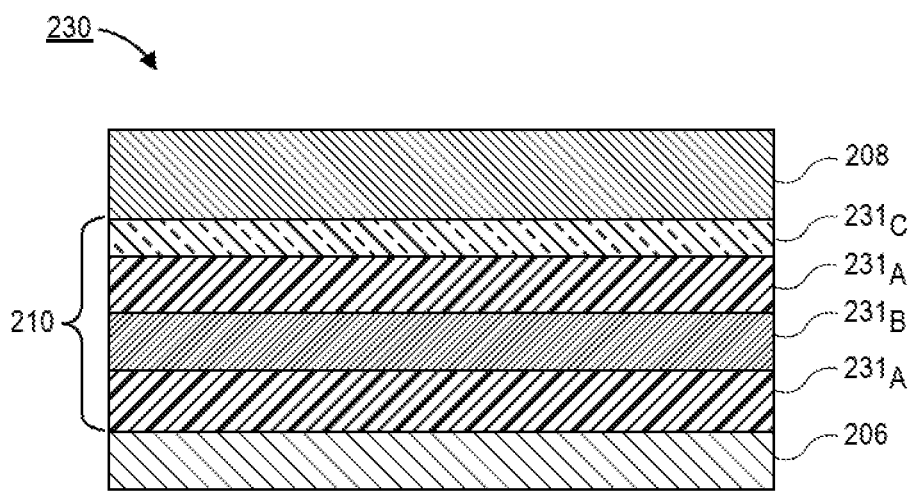
FIG. 2G is a cross-sectional illustration of a gate electrode that comprises a first dielectric material over and below a second dielectric material and a third dielectric material layer over the uppermost first dielectric material, in accordance with an embodiment.

Referring now to FIG. 2G, a cross-sectional illustration of a gate dielectric stack 210 is shown, in accordance with an additional embodiment. In an embodiment, the gate dielectric stack 210 may comprise alternating layers of a first high-k dielectric layer $231_A$ and a second high-k dielectric layer $231_B$, and a third high-k dielectric layer $231_C$. In an embodiment, the alternating layers $231_A$ and $231_B$ may comprise any number of layers. For example, the alternating layers may comprise a superlattice, similar to the superlattice described with respect to FIG. 2F. In an embodiment, the third high-k dielectric layer $231_C$ may be formed as an uppermost layer of the gate dielectric stack 210. In an embodiment, the third high-k dielectric layer $231_C$ may be a material that is particularly resistant to crystallizing. As such, the interface between the gate dielectric stack 210 and the crystalline semiconductor 208 will ensure proper self-aligning of the crystalline semiconductor. In an embodiment, the third high-k dielectric layer $231_C$ may be $Al_2O_3$.

Figure 3A:
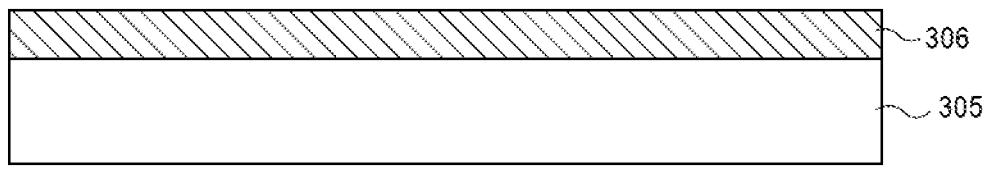
FIG. 3A is a cross-sectional illustration of a gate electrode over a substrate, in accordance with an embodiment.

Referring now to FIGS. 3A-3E, a series of cross-sectional illustrations of a process for fabricating a crystalline TFT is shown, in accordance with an embodiment. Referring now to FIG. 3A, a cross-sectional illustration of a substrate 305 and a gate electrode 306 over the substrate 305 is shown, in accordance with an embodiment. In an embodiment, the gate electrode 306 may be formed with any suitable deposition process, such as electroplating, chemical vapor deposition (CVD) or physical vapor deposition (PVD). In an embodiment, the gate electrode 306 is composed of a conductive material such as, but not limited to, Cu, Al, Ti, Zr, Hf, V, Ru, Co, Ni, Pd, Pt, W, Ag, Au or alloys thereof.

Figure 3B:
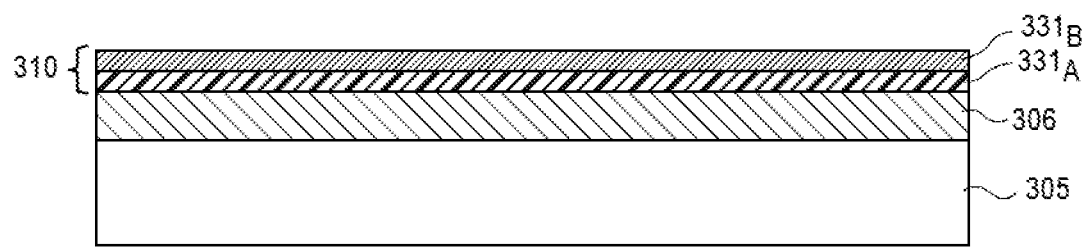
FIG. 3B is a cross-sectional illustration after the gate dielectric stack is formed over the gate electrode, in accordance with an embodiment.

Referring now to FIG. 3B, a cross-sectional illustration after a gate dielectric stack 310 is formed over the gate electrode 306 is shown, in accordance with an embodiment. In an embodiment, the gate dielectric stack 310 may comprise any gate dielectric stack described above with respect to FIGS. 1A-2G. For example, the gate dielectric stack 310 may comprise a plurality of high-k dielectric layers 331. In an embodiment, the high-k dielectric layers 331 may comprise alternating layers of a first high-k dielectric layer $331_A$ and a second high-k dielectric layer $331_B$. In an embodiment, the high-k dielectric layers 331 may be formed with an atomic layer deposition (ALD) process, a plasma enhanced ALD (PEALD) process, or the like. In an embodiment, the gate dielectric stack 310 may comprise one or more layers of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

In an embodiment, the plurality of high-k dielectric layers 331 may each have a thickness that is below a threshold where the material begins to crystallize. In an embodiment, the uppermost high-k dielectric layer 331 may have a thickness that is below a threshold where the material begins to crystallize. In an embodiment, the uppermost high-k dielectric layer 331 may be more resistant to crystallization than underlying high-k dielectric layers 331.

Figure 3C:
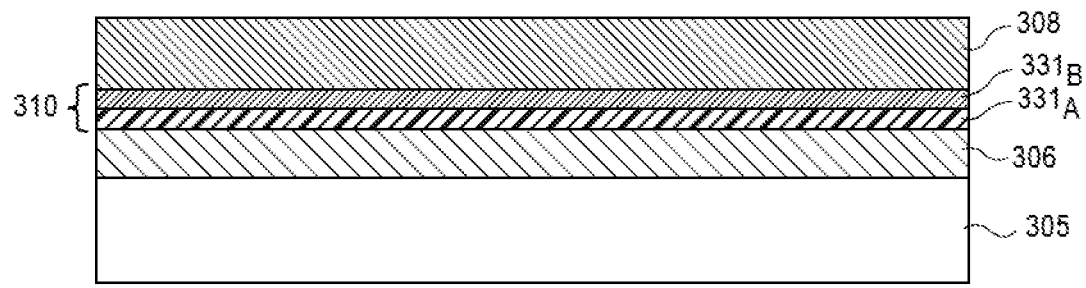
FIG. 3C is a cross-sectional illustration after the crystalline semiconductor layer is formed over the gate dielectric stack, in accordance with an embodiment.

Referring now to FIG. 3C, a cross-sectional illustration after a crystalline semiconductor material 308 is formed over the gate dielectric stack 310. In an embodiment, the crystalline semiconductor layer 308 may comprise one or more layers of semiconductor material. For example, semiconductor layer 308 may comprise one or more of ZnO, $Al_2O_5Zn_2$, aluminum doped ZnO (AZO), InZnO (IZO), indium tin oxide (ITO), InZnO, $In_2O_3$, $Ga_2O_3$, InGaZnO, semiconductor materials comprising other III-V materials, combinations (e.g., alloys or stacked layers) of semiconductor materials, and the like. As used herein, the term "crystalline semiconductor" may refer to polycrystalline or single crystalline semiconductors. In an embodiment, the crystalline semiconductor layer 308 may comprise a plurality of layers, where at least one of the layers is a crystalline semiconductor.

Figure 3D:
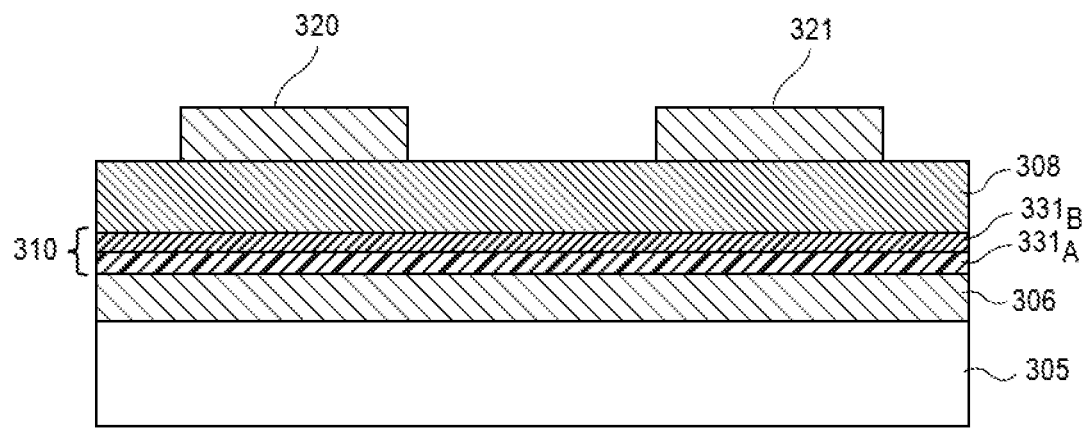
FIG. 3D is a cross-sectional illustration after a source and drain electrode are formed over the semiconductor layer, in accordance with an embodiment.

Referring now to FIG. 3D, a cross-sectional illustration after a source electrode 320 and a drain electrode 321 are formed over the semiconductor layer 308 is shown, in accordance with an embodiment. In an embodiment, the source electrode 320 and the drain electrode 321 may be formed with any suitable deposition process, such as electroplating, CVD or PVD. In an embodiment, the source electrode 320 and the drain electrode 321 are composed of a conductive material such as, but not limited to, Cu, Al, Ti, Zr, Hf, V, Ru, Co, Ni, Pd, Pt, W, Ag, Au or alloys thereof. In an embodiment, a conductive layer may be deposited over the semiconductor layer 308 and patterned (e.g., with lithographic patterning) to define the source electrode 320 and the drain electrode 321.

Figure 3E:
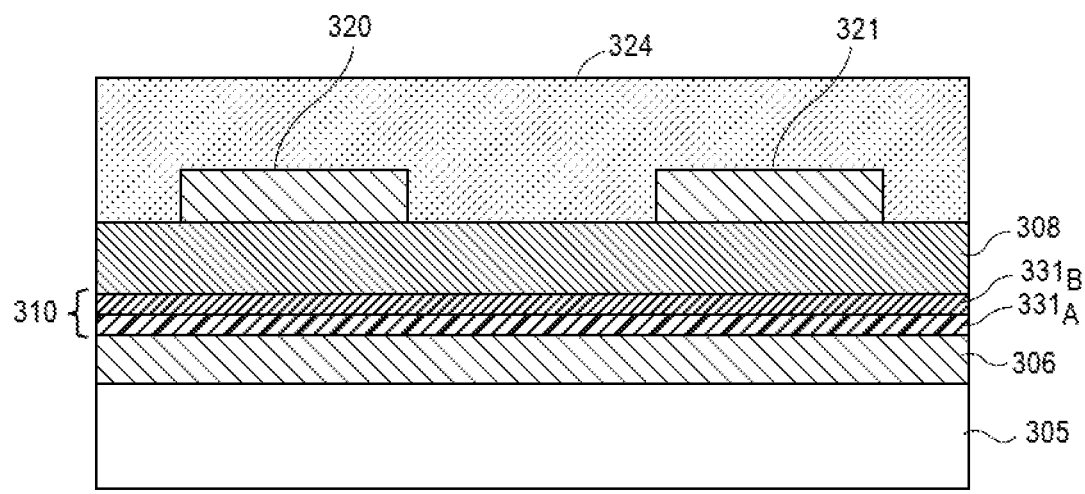
FIG. 3E is a cross-sectional illustration after an insulating layer is formed over the source and drain electrodes, in accordance with an embodiment.

Referring now to FIG. 3E, a cross-sectional illustration after an insulating layer 324 is formed over the source electrode 320, the drain electrode 321, and the semiconductor layer 308 is shown, in accordance with an embodiment. In an embodiment, the insulating layer 324 may be any suitable insulating material that electrically isolates portions of the TFT. For example, the insulating layer 324 may be a low-k material, such as $SiO_2$ or the like. The insulating layer 324 may be referred to as an interlayer dielectric (ILD) in some embodiments. For example, when the TFT is fabricated in the BEOL stack of a device, the insulating layer 324 may be an ILD layer.

It is to be appreciated that the layers and materials described above may be formed in, on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level back end of line (BEOL) interconnect layers.

Although the preceding methods of fabricating TFT are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, electrodes (e.g., the gate electrode, the source electrode, and the drain electrode) are composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal electrodes may include barrier layers (e.g., layers including one or more of Ta, TaN, Ti or TiN), stacks of different metals or alloys, etc. Thus, the electrodes may be a single material layer, or may be formed from several layers, including conductive liner layers and fill layers. Any suitable deposition process, such as electroplating, chemical vapor deposition or physical vapor deposition, may be used to form electrodes. In an embodiment, the electrodes are composed of a conductive material such as, but not limited to, Cu, Al, Ti, Zr, Hf, V, Ru, Co, Ni, Pd, Pt, W, Ag, Au or alloys thereof.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 4:
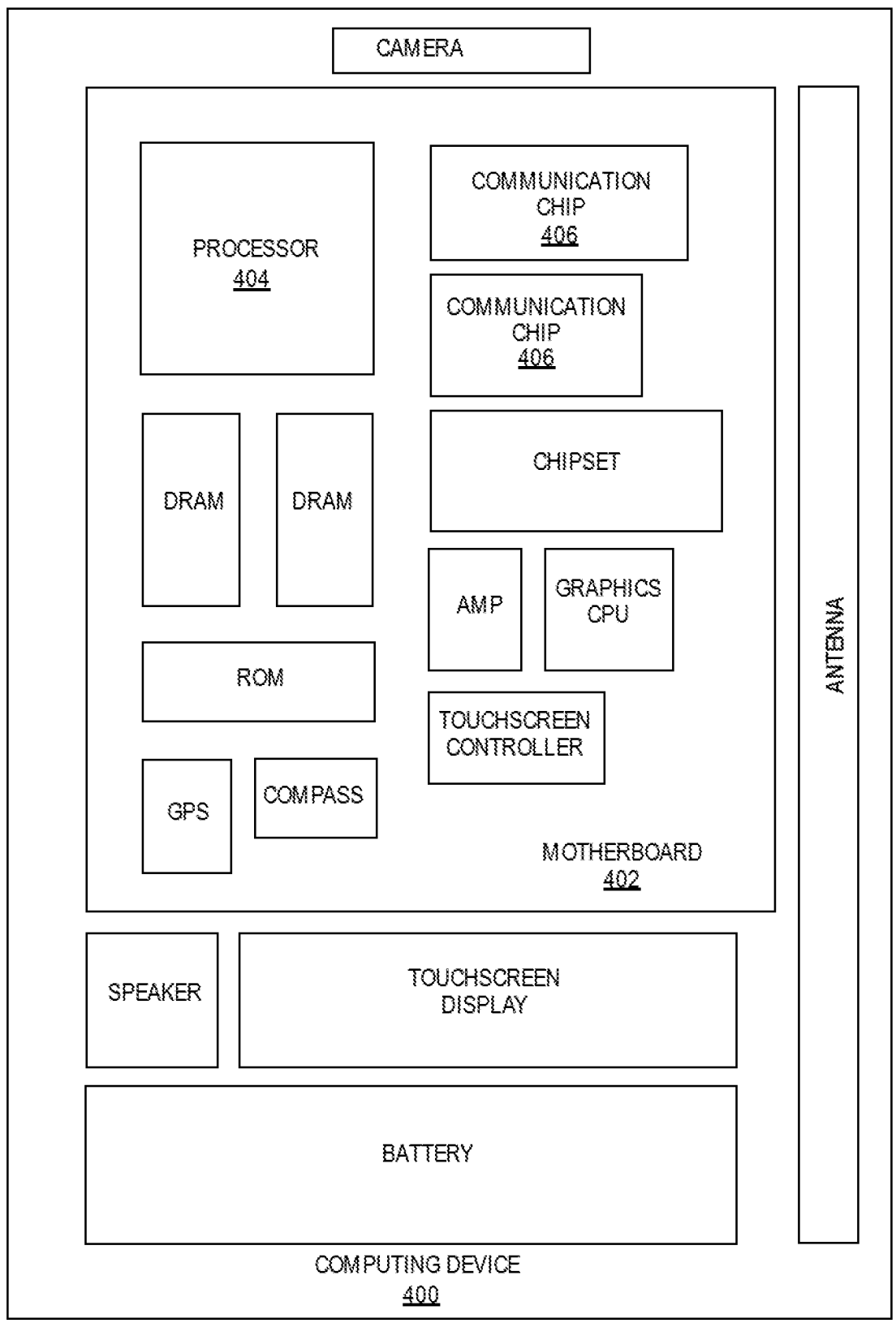
FIG. 4 illustrates a computing device in accordance with one implementation of an embodiment of the disclosure.

FIG. 4 illustrates a computing device 400 in accordance with one implementation of an embodiment of the disclosure. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In an embodiment, the integrated circuit die of the processor includes a crystalline TFT device with a gate dielectric stack that comprises a plurality of amorphous high-k dielectric layers, as described herein. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In an embodiment, the integrated circuit die of the communication chip includes a crystalline TFT device with a gate dielectric stack that comprises a plurality of amorphous high-k dielectric layers, as described herein.

In further implementations, another component housed within the computing device 400 may contain an integrated circuit die that includes a crystalline TFT device with a gate dielectric stack that comprises a plurality of amorphous high-k dielectric layers, as described herein.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Figure 5:
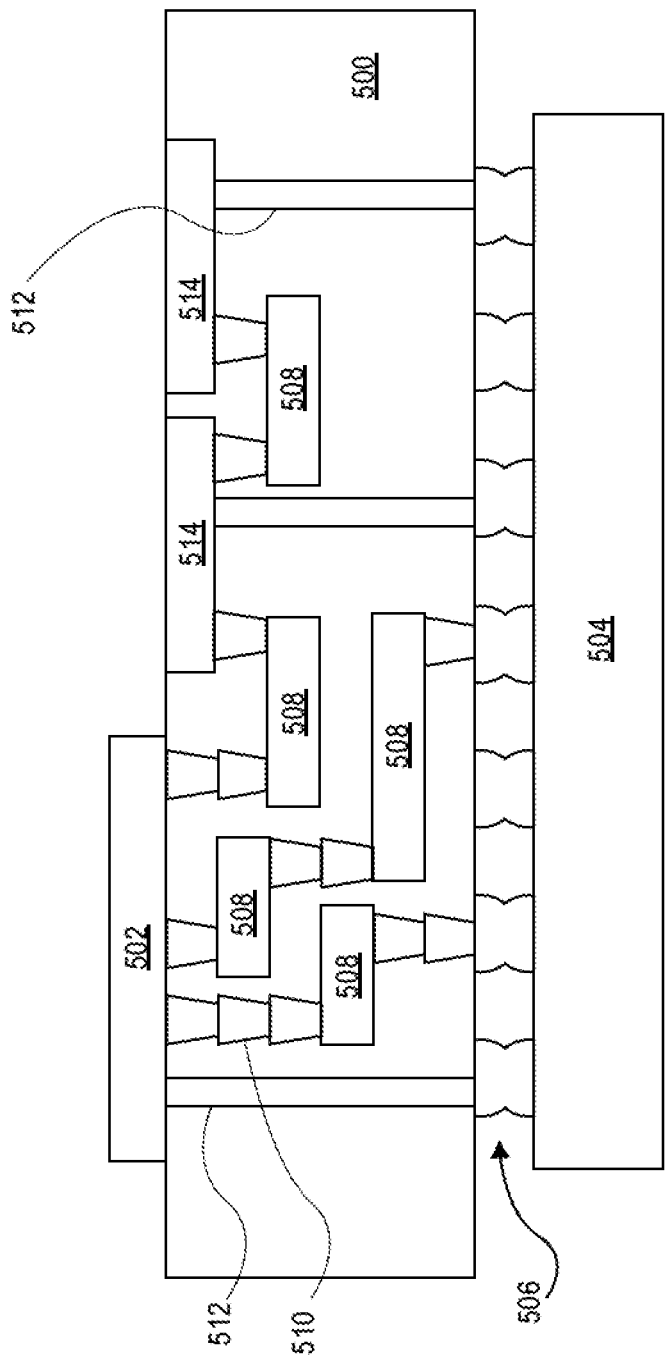
FIG. 5 is an interposer implementing one or more embodiments of the disclosure.

FIG. 5 illustrates an interposer 500 that includes one or more embodiments of the disclosure. The interposer 500 is an intervening substrate used to bridge a first substrate 502 to a second substrate 504. The first substrate 502 may be, for instance, an integrated circuit die. The second substrate 504 may be, for instance, a memory module, a computer motherboard, or another integrated circuit die. Generally, the purpose of an interposer 500 is to spread a connection to a wider pitch or to reroute a connection to a different connection. For example, an interposer 500 may couple an integrated circuit die to a ball grid array (BGA) 506 that can subsequently be coupled to the second substrate 504. In some embodiments, the first and second substrates 502/504 are attached to opposing sides of the interposer 500. In other embodiments, the first and second substrates 502/504 are attached to the same side of the interposer 500. And in further embodiments, three or more substrates are interconnected by way of the interposer 500.

The interposer 500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 508 and vias 510, including but not limited to through-silicon vias (TSVs) 512. The interposer 500 may further include embedded devices 514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 500. In accordance with embodiments of the disclosure, apparatuses or processes disclosed herein may be used in the fabrication of interposer 500.

Thus, embodiments of the present disclosure includes a crystalline TFT device with a gate dielectric stack that comprises a plurality of amorphous high-k dielectric layers, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a thin film transistor, comprising: a substrate; a gate electrode over the substrate; a gate dielectric stack over the gate electrode, wherein the gate dielectric stack comprises a plurality of layers; a semiconductor layer over the gate dielectric, wherein the semiconductor layer is a crystalline semiconductor layer; and a source electrode and a drain electrode.

Example 2: the thin film transistor of Example 1, wherein an uppermost layer of the gate dielectric stack is amorphous.

Example 3: the thin film transistor of Example 1 or Example 2, wherein the gate dielectric stack comprises a bilayer.

Example 4: the thin film transistor of Examples 1-3, wherein an uppermost layer of the bilayer comprises $Al_2O_3$.

Example 5: the thin film transistor of Examples 1-4, wherein the gate dielectric stack comprises alternating layers of a first dielectric material and a second dielectric material.

Example 6: the thin film transistor of Examples 1-5, wherein the gate dielectric stack further comprises a third dielectric material forming an uppermost layer of the gate dielectric.

Example 7: the thin film transistor of Examples 1-6, wherein the first dielectric material is $HfO_2$ and wherein the second dielectric material is $Al_2O_3$.

Example 8: the thin film transistor of Examples 1-7, wherein the first dielectric material or the second dielectric material further comprises silicon.

Example 9: the thin film transistor of Examples 1-8, wherein the first dielectric material or the second dielectric material comprises between 20-50 atomic weight percent silicon.

Example 10: the thin film transistor of Examples 1-9, wherein the gate dielectric stack comprises a high-k dielectric layer.

Example 11: the thin film transistor of Examples 1-10, wherein a thickness of each of the plurality of layers of the gate dielectric stack is less than 10 nm.

Example 12: the thin film transistor of Examples 1-11, wherein a thickness of each of the plurality of layers of the gate dielectric stack is less than 5 nm.

Example 13: the thin film transistor of Examples 1-12, wherein the gate dielectric stack comprises two or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 14: a method of forming a thin film transistor, comprising: forming a gate electrode over a substrate; forming a gate dielectric stack over the gate electrode, wherein the gate dielectric stack comprises an amorphous layer; forming a semiconductor layer over the gate dielectric stack, wherein the semiconductor layer is a crystalline semiconductor layer; and forming a source electrode and a drain electrode over the semiconductor layer.

Example 15: the method of Example 14, wherein the gate dielectric stack comprises at least a first dielectric material and a second dielectric material.

Example 16: the method of Example 14 or Example 15, wherein the first dielectric material and the second dielectric material are formed in an alternating pattern.

Example 17: the method of Examples 14-16, wherein the first dielectric material comprises $HfO_2$ and the second dielectric material comprises $Al_2O_3$.

Example 18: the method of Examples 14-17, wherein the gate dielectric stack is formed with an atomic layer deposition (ALD) process.

Example 19: the method of Examples 14-18, wherein an uppermost layer of the gate dielectric stack comprises $Al_2O_3$.

Example 20: the method of Examples 14-19, wherein the gate dielectric stack comprises a plurality of dielectric layers, and wherein each of the dielectric layers has a thickness less than 10 nm.

Example 21: the method of Examples 14-20, wherein the gate dielectric layer comprises silicon.

Example 22: a computing device, comprising: an integrated circuit die, wherein the integrated circuit die comprises a thin film transistor, wherein the thin film transistor comprises: a substrate; a gate electrode over the substrate; an amorphous gate dielectric over the gate electrode; a crystalline semiconductor layer over the gate dielectric; and a source electrode and a drain electrode.

Example 23: the computing device of Example 22, wherein the gate dielectric comprises a bilayer.

Example 24: the computing device of Example 22 or Example 23, wherein the gate dielectric comprises a plurality of alternating first dielectric layers and second dielectric layers.

Example 25: the computing device of Examples 22-24, wherein the gate dielectric comprises a layer of $HfO_2$ and a layer of $Al_2O_3$.

What is claimed is:

1. A thin film transistor, comprising:
   a substrate;
   a gate electrode over the substrate;
   a gate dielectric stack over the gate electrode, wherein the gate dielectric stack comprises a plurality of layers, the plurality of layers comprising a first layer of 1, 2, 11, 12, 14, 18, 20, and 22, a layer of $Al_2O_3$ on the first layer of $HfO_2$, and a second layer of $HfO_2$ on the layer of $Al_2O_3$, wherein a first one of the plurality of layers has a first thickness, and a second one of the plurality of layers has a second thickness different than the first thickness;
   a semiconductor layer over the gate dielectric stack, wherein the semiconductor layer comprises a crystalline semiconductor layer in direct contact with the second layer of $HfO_2$ of the gate dielectric stack; and
   a source electrode and a drain electrode, both the source electrode and the drain electrode directly on and in contact with the crystalline semiconductor layer, wherein the gate electrode extends laterally at least as wide as the semiconductor layer and at least as wide as the gate dielectric stack.

2. The thin film transistor of claim 1, wherein an uppermost layer of the gate dielectric stack is amorphous.

3. The thin film transistor of claim 1, wherein a thickness of each of the plurality of layers of the gate dielectric stack is less than 10 nm.

4. The thin film transistor of claim 3, wherein a thickness of each of the plurality of layers of the gate dielectric stack is less than 5 nm.

5. A method of forming a thin film transistor, comprising:
   forming a gate electrode over a substrate;
   forming a gate dielectric stack over the gate electrode, wherein the gate dielectric stack comprises a first layer of $HfO_2$ in direct contact with the gate electrode, a layer of $Al_2O_3$ on the first layer of $HfO_2$, and a second layer of $HfO_2$ on the layer of $Al_2O_3$, and wherein a first layer of the gate dielectric stack has a first thickness, and a second layer of the dielectric stack has a second thickness different than the first thickness;
   forming a semiconductor layer over the gate dielectric stack, wherein the semiconductor layer comprises a crystalline semiconductor layer in direct contact with the second layer of $HfO_2$ of the gate dielectric stack; and
   forming a source electrode and a drain electrode directly on the crystalline semiconductor layer, wherein the gate electrode extends laterally at least as wide as the semiconductor layer and at least as wide as the gate dielectric stack.

6. The method of claim 5, wherein the gate dielectric stack is formed with an atomic layer deposition (ALD) process.

7. The method of claim 5, wherein each of the dielectric layers has a thickness less than 10 nm.

8. A computing device, comprising:
   an integrated circuit die, wherein the integrated circuit die comprises a thin film transistor, wherein the thin film transistor comprises:
   a substrate;
   a gate electrode over the substrate;
   an amorphous gate dielectric over the gate electrode, wherein the amorphous gate dielectric comprises a plurality of layers, the plurality of layers comprising a first layer of $HfO_2$ in direct contact with the gate electrode, a layer of $Al_2O_3$ on the first layer of $HfO_2$, and a second layer of $HfO_2$ on the layer of $Al_2O_3$, and wherein a first layer of the amorphous gate dielectric has a first thickness, and a second layer of the amorphous gate dielectric has a second thickness different than the first thickness;
   a crystalline semiconductor layer over and in direct contact with the second layer of $HfO_2$ of the amorphous gate dielectric; and
   a source electrode and a drain electrode, both the source electrode and the drain electrode directly on and in contact with the crystalline semiconductor layer, wherein the gate electrode extends laterally at least as wide as the semiconductor layer and at least as wide as the amorphous gate dielectric.

* * * * *